US006430651B1

(12) United States Patent
Isobe

(10) Patent No.: US 6,430,651 B1
(45) Date of Patent: Aug. 6, 2002

(54) MEMORY DEVICE FOR CONSTITUTING A MEMORY SUBSYSTEM OF A DATA PROCESSING APPARATUS

(75) Inventor: Tadaaki Isobe, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/352,952

(22) Filed: Jul. 14, 1999

(30) Foreign Application Priority Data

Jul. 14, 1998 (JP) .......................................... 10-199008

(51) Int. Cl.$^7$ ................................................ G11C 7/00
(52) U.S. Cl. ............. 711/104; 365/189.01; 365/189.02; 365/189.05; 365/189.12; 365/230.01; 365/230.08; 365/238.5
(58) Field of Search ...................... 711/104; 365/189.01, 365/189.02, 189.05, 189.12, 230.01, 230.08, 238.5

(56) References Cited

U.S. PATENT DOCUMENTS

| 4,899,310 A | * | 2/1990 | Baba et al. ............. 365/189.05 |
| 5,268,873 A | * | 12/1993 | Suzuki ..................... 365/233.5 |
| 5,371,711 A | * | 12/1994 | Nakayama ............. 365/230.03 |
| 5,602,781 A | | 2/1997 | Isobe ..................... 365/189.05 |

FOREIGN PATENT DOCUMENTS

JP          7-262083          10/1995

OTHER PUBLICATIONS

"Strong Competition on Post–DRAM: Protocol Control Method is Acceptable?", Nikkei Microdevices, Apr. 19996, pp. 74–83.
Nakamura et al., "Pseudo Vector Processor based on Register Window and Superscalar Pipeline", Reports of Parallel Processing Symposium JSPP, '92, pp. 367–374.
Murakami et al., "Micro–vectorprocessor Architectures", Study Reports of Information Processing Society of Japan, Jun. 12, 1992, pp. 17–24.
"US PC industries starting: Reduction in Total Memory Quantities", Nikkei Microdevices, Feb. 1996, pp. 42–62.
"Virtual Channel Memory: Effective in Plural Memory Masters", Nikkei Microdevices, Feb. 1998, pp. 142–149.
Ito, "Ultra LSI Memory", Baifukan, Nov. 5, 1994, pp. 161–173.

* cited by examiner

*Primary Examiner*—Do Hyun Yoo
*Assistant Examiner*—Mehdi Namazi
(74) *Attorney, Agent, or Firm*—Antonelli, Terry, Stout & Kraus, LLP

(57) ABSTRACT

In a memory device capable of processing a small amount of data in a high speed, this memory device is suitable for various sorts of systems in which a plurality of access requests for continuous addresses are mixed with each other, and are issued as irregular requests to a memory subsystem. A data array is provided in a memory device having a memory cell. This data array may be arranged as a virtual register array having an arbitrary number of arbitrary word length. The data register array is accessed by employing a virtual register number and a virtual word number, which are supplied from an external circuit provided outside the memory device. In the memory device, both the virtual register number and the virtual word number, which are supplied from the external circuit, are converted into both an absolute register number and an absolute word number by an internally-provided converting circuit so as to access the data register array. With employment of such an arrangement, the respective structures of the data register array are separately optimized with respect to different application programs, so that accessing efficiencies can be improved.

11 Claims, 9 Drawing Sheets

FIG.2
(a) READ (ACCESS TO MEMORY CELL/NO DATA IS REGISTERED INTO DATA REGISTER ARRAY)
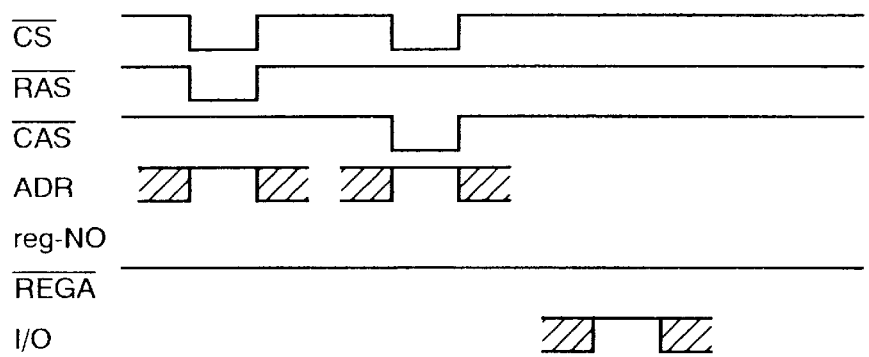
(b) READ (ACCESS TO MEMORY CELL/DATA IS REGISTERED INTO DATA REGISTER ARRAY)
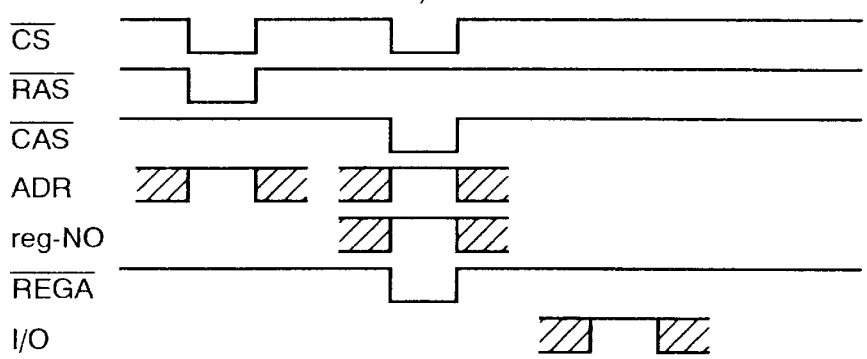
(c) READ (ACCESS TO DATA REGISTER ARRAY)
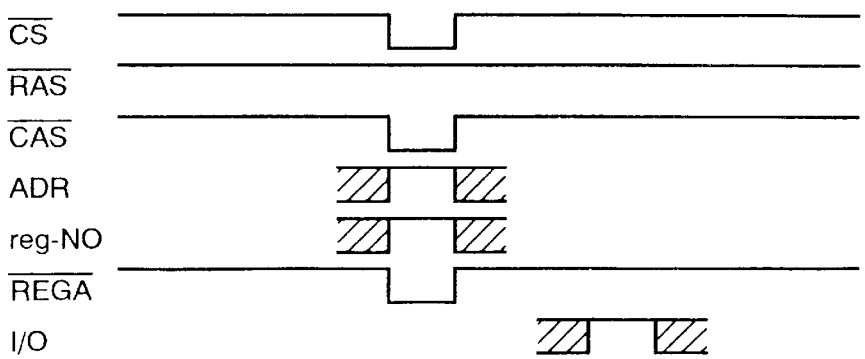

FIG.4
(a) WRITE (ACCESS TO MEMORY CELL/NO ACCESS TO DATA REGISTER ARRAY)
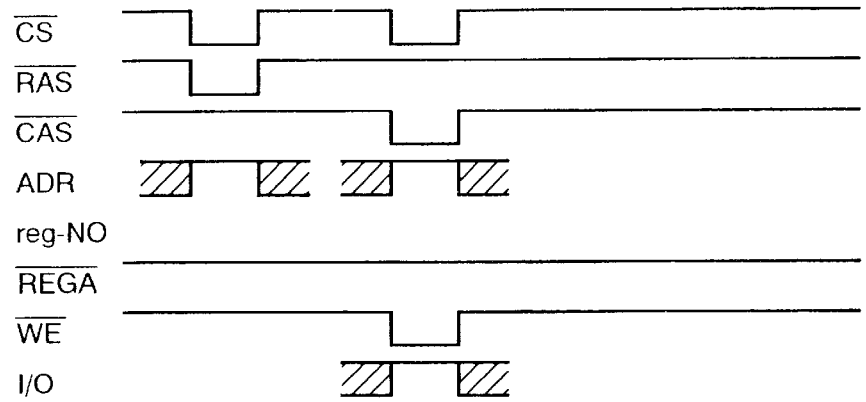
(b) WRITE (ACCESS TO MEMOTY CELL/DATA IS WRITTEN INTO DATA REGISTER ARRAY)
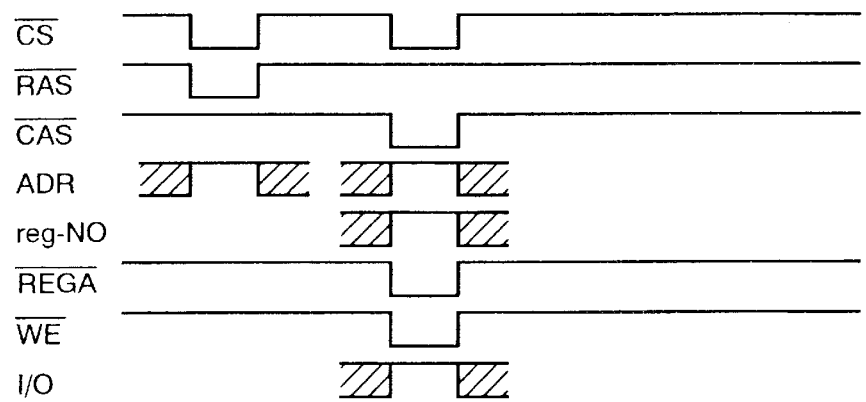
(c) WRITE (ACCESS TO DATA REGISTER ARRAY)
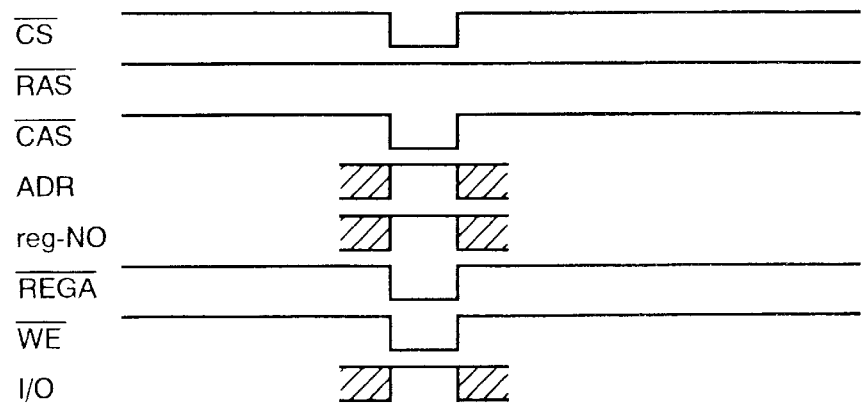

FIG.5
(a) WRITE (DATA IS REWRITTEN FROM DATA REGISTER ARRAY TO MEMORY CELL)
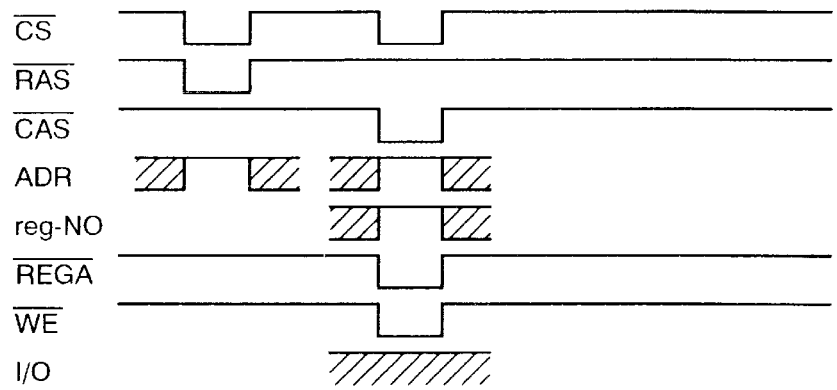
(b) WRITE (ACCESS TO MEMORY CELL/DATA IS WRITTEN INTO DATA REGISTER ARRAY (2ND))
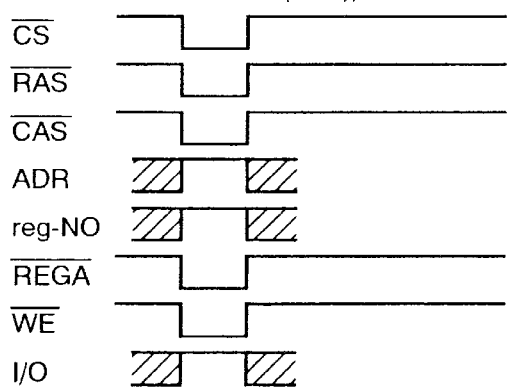
(c) WRITE (DATA IS REWRITTEN FROM DATA REGISTER ARRAY TO MEMOTY CELL(2ND))
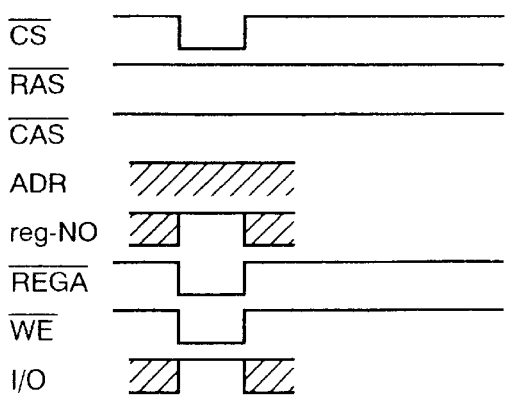

REAL STRUCTURE

VIRTUAL STRUCTURE 1

VIRTUAL STRUCTURE 2

VIRTUAL STRUCTURE 3

FIG.7

(1) IN CASE THAT SIZES OF VIRTUAL REGISTERS ARE UNIFORM

ABSOLUTE Reg# = QUOTIENT OF [VIRTUAL Reg# ÷ (REAL RS ÷ VIRTUAL RS)]
+QUOTIENT OF [VIRTUAL W# ÷ REAL RS]

ABSOLUTE W# = (VIRTUAL Reg# × VIRTUAL RS) + VIRTUAL W#
− (ABSOLUTE Reg# × REAL RS)

(2) IN CASE THAT SIZES OF VIRTUAL REGISTERS ARE NOT EGUAL TO EACH OTHER
(IN CASE THAT BOUNDARY OF VIRTUAL REGISTER SIZE IS ONE )

(2-1) WHEN VIRTUAL Reg# IS SMELLER THAN, OR EQUAL TO Reg# OF VIRTUAL
REGISTER JUST BEFORE VIRTUAL REGISTER SIZE BOUNDARY

ABSOLUTE Reg# = QUOTIENT OF [VIRTUAL Reg# ÷ (REAL RS ÷ VIRTUAL RS)]
+QUOTIENT OF [VIRTUAL W# ÷ REAL RS]

ABSOLUTE W# = (VIRTUAL Reg# × VIRTUAL RS) + VIRTUAL W#
− (ABSOLUTE Reg# × REAL RS)

(2-2) WHEN VIRTUAL Reg# IS LARGER THAN Reg# OF VIRTUAL REGISTER
JUST BEFORE VIRTUAL REGISTER SIZE BOUNDARY

ABSOLUTE Reg# = QUOTIENT OF [MINIMUM VIRTUAL Reg# OF VIRTUAL REGISTER
WHICN EXCEEDS BOUNDARY ÷ (REAL RS ÷ VIRTUAL RS1)]
+ QUOTIENT OF [(VIRTUAL Reg# − MINIMUM VIRTUAL Reg# OF
VIRTUAL REGISTER WHICH EXCEEDS BOUNDATY)
÷ (REAL RS ÷ VIRTUAL RS2)]
+ QUOTIENT OF [ VIRTUAL W# ÷ REAL RS]

ABSOLUTE W# = (MINIMUM VIRTUAL Reg# OF VIRTUAL REGISTER WHICH
EXCEEDS BOUNDARY × VIRTUAL RS1)
+(VIRTUAL Reg# − MINIMUM Reg# OF VIRTUAL REGISTER WHICH
EXCEEDS BOUNDARY) × VIRTUAL RS2
+VIRTUAL W#
− BOUNDARY Reg# × REAL RS

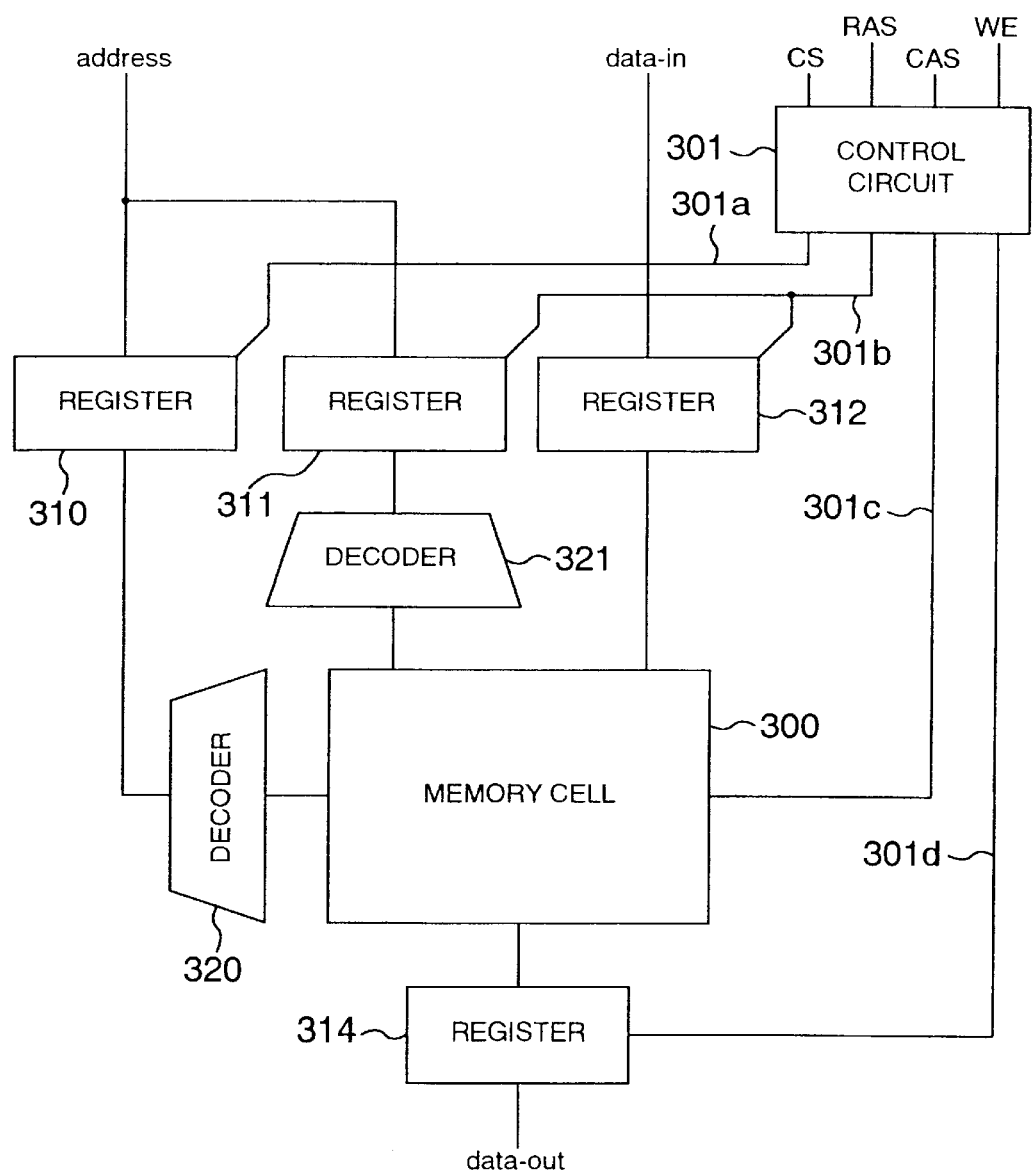

MEMORY DEVICE FOR CONSTITUTING A MEMORY SUBSYSTEM OF A DATA PROCESSING APPARATUS

BACKGROUND OF THE INVENTION

The present invention is related to a memory device for constituting a memory subsystem of a data processing apparatus. More specifically, the present invention is directed to such a memory device suitably used to a memory subsystem of such a type of data processing apparatus that a large amount of data is directly supplied from a storage apparatus having a large storage capacity.

Very recently, since operating speeds of microprocessors are increased, remarkable advances appear in highspeed operations/high performance of peripheral components capable of supporting microprocessors. For instance, as to memory devices, various future types of "synchronous DRAMs" have been proposed, e.g., "MoSys DRAM (MDRA)", "Media DRAM", and "SyncLink DRAM", which are described in Japanese magazine "NIKKEI MICRODEVICE" entitled "Strong Competition on Post-SDRAM: Protocol Control Method is Acceptable?" issued in April, 1996, pages 74 to 83 (will be referred to a "publication No. 1" hereinafter). Thus, there is a trend such that these synchronous DRAMs are standardized as main memories of information processing appliances.

On the other hand, performance of microprocessors is drastically improved in connection with great progress of semiconductor technology and development in the RISC techniques. In particular, since semiconductor technology is considerably advanced, operating frequencies of semiconductor chips for constituting highspeed microprocessors may exceed 500 MHz. While such highspeed microprocessors are commercially available, performance of electronic systems with employment of this sort of highspeed processor is similarly improved.

However, the following problems are revealed when the above-explained: electronic systems are practically realized.

That is, in general, the above-described high performance microprocessors can have sufficiently high capabilities while processing data held in cache memories employed inside processors and in peripheral circuits thereof are accessible by these electronic components in high speeds. However, when huge problems such as scientific technical calculations are tried to be solved by these high performance microprocessors, data to be handled cannot be held in these cache memories. Therefore, there is a problem such that the actual performance of these microprocessors would be considerably lowered. In other words, since a so-called "cache miss" happens to occur, processor waiting states will occur while data are transferred from either main memory or memory subsystems of lower hierarchy to the cache memories. As a result, the processors are brought into idle states and the system performance would be greatly lowered. The degree in lowering of this system performance is described in, for example, "Pseudo Vector Processor based on Register Window and Superscalar Pipeine" written in Parallel Processing Symposium JSPP, published in 1992, pages 367 to 374 (will be referred to as a "publication No. 2" hereinafter).

In this publication No. 2, the pseudo vector processor is proposed so as to solve such a cache miss problem. Then, in this pseudo vector processor, while a large number of registers are provided within this vector processor, the memory access operations for either the main memory or the memory subsystem of the lower hierarchy are carried out in the pipeline manner, so that lowering of the performance caused by the data waiting time could be minimized.

However, in this pseudo vector processor, the throughput degree required for either the main memory or the memory subsystem of the lower hierarchy is extremely high, as compared with a throughput degree for a normal microprocessor system equipped with a general-purpose cache memory and required for either a main memory thereof or a memory subsystem of a lower hierarchy. This is because this approach by a pseudo vector processor is intended to hide an increase of latency in accessing to either the main memory or the memory subsystem of the lower hierarchy by employing the pipeline structure, not to reduce an data amount to be treated.

As a consequence, either the main memory or the memory subsystem of the lower hierarchy used for the above-explained pseudo vector processor is necessarily constituted by employing the multi-bank structure in order to realize a large memory capacity as well as a high throughput. In this multi-bank structure, a plurality of memory devices equipped with highspeed interfaces such as synchronous DRAMs are arranged in a parallel manner.

A higher need for either a main memory or a memory subsystem of a lower hierarchy with a large memory capacity and a high throughput is required other than the pseudo vector processor. Another approach to solve the each cache miss problem, different from the above-explained architecture, is described in Micro-vector processor Architectures" written in the research report by Information Processing Society of Japan published on Jun. 12, 1992, pages 17 to 24 (will be referred to as a "publication No. 3" hereinafter).

In the above-described publication, one approach has been proposed in order to avoid lowering of the effective memory access performance. That is, in such a case that the function of the vector processor is manufactured in a single semiconductor chip by utilizing the high integration technique, the multithread processing operation in the vector instruction level is carried out as to the problem in which a total number of memory access pipelines is restricted by the input/output pin neck. Also, in this case, the high throughput is required for either the main memory or the memory subsystem of the lower hierarchy. As a result, similar to the pseudo vector processor, it is required to prepare either the main memory or the memory subsystem of the lower hierarchy, which owns the multi-bank structure.

A common necessary subject matter for such systems with employment of the above-explained two different architectures is given as follows. That is, either a main memory having a high memory capacity/throughput or a memory subsystem having high memory capacity/throughput of a lower hierarchy must be realized by using a small amount of electronic components and made in low cost. In other words, this common necessary subject matter implies that such a memory system is required to be provided, and this memory system is matched with a trend in a low-cost/compact processor. If such a memory system could not be realized, then the system balance would be destroyed and therefore the system value would be lost.

Similarly, completely different systems have been proposed. That is, the "unified memory architecture (UMA)" system has been proposed as a measure capable of constructing relatively low-cost personal computers, in which a cache memory mounted outside a processor is reduced, and/or other memories (frame buffer and the like) than a main memory may function as this main memory. This new trend is disclosed in Japanese magazine "NIKKEI MICRODEVICE" entitled "US PC industries starting - - - reduction in total memory quantities" issued in February 1996, pages 42 to 62 (will be referred to as a "publication No. 4" hereinafter). This system described in the publication No. 4 is arranged by that there are two large flows in memory accesses.

As one memory access flow, there is such an access operation from the processor functioning as the main memory, whereas as another memory access, there is such a sequential access operation from the graphics controller as the frame buffer. Then, the above-explained memory access system is featured by employing such a mode that a plurality of access, streams may access one memory subsystem. It should be understood that the performance of the memory subsystem must be maintained to some extent so as to achieve the practically meaningful mode. To this end, some data supplying ideas are necessarily required in low cost (namely, suppressing of increase in total component quantity) without largely lowering the resultant throughput with respect to a plurality of access streams.

There is a key point how to provide, or realize high performance main memory, or high performance memory subsystems of lower hierarchies even when systems having any one of the above-described architectures "pseudo vector processor", "microvector processor", and also "unified memory architecture" are practically established.

To realize a high throughput main memory, or a high throughput memory subsystem of a lower hierarchy by utilizing the conventional techniques, the system having the multi-bank structure and using "synchronous DRAMs" may constitute the most effective way.

FIG. 8 is a schematic block diagram for showing a system arrangement of a data processing apparatus with employment of a conventional synchronous DRAM. FIG. 8 is a schematic block diagram for indicating a structure of the conventional synchronous DRAM. Referring now to FIG. 8 and FIG. 9, the conventional synchronous DRAM will be explained.

In FIG. 8 and FIG. 9, reference numeral 200 shows an instruction processor, reference numerals 201 and 202 indicate data streams, reference numeral 203 represents a multiplexer, and reference numeral 220 denotes a memory subsystem. Also, numerals 221 to 228 show synchronous DRAMs, numeral 300 is a memory cell, reference numeral 301 shows a control circuit, numerals 310 to 312, and 314 represent registers, and numerals 320 and 321 indicate decoders.

In FIG. 9 which represents the structure of the conventional synchronous DRAM, the registers 310, 311, 312, and 314 provided in this DRAM hold the relevant signals of row-address signal, column-address signal, data-in signal, and data-out signal in response to a clock supplied outside this memory chip. The decoder 320 corresponds to a decoder for the row-address signal, and the decoder 321 corresponds to a decoder for the column-address signal. The memory cell 300 is accessed by the outputs from the decoders 320 and 321. Based upon the respective control signals CS, RAS, CAS, and WE, the control circuit 301 produces set signals 301a and 301b supplied to the address registers 310 and 311, and also produces a set signal 301b supplied to the write register 314. Also, the control circuit 301 produces a set signal 301d supplied to the read data register 314, and also produces a set signal 301c supplied to the memory cell 300.

The synchronous DRAM shown in FIG. 9 is featured by such that the external interface of this synchronous DRAM is constituted by the pipeline system. In other words, the interface interfacing between the control logic (memory control device) of the DRAM and this DRAM is realized as such an interface capable of performing the synchronous transfer operation in response to the sync clock. As a result, synchronous DRAMs corresponding to a plurality of banks may be connected to one set of memory interfaces.

The conventional data processing apparatus indicated in FIG. 8 is arranged by the instruction processor (command processor) 200, the memory control apparatus 210, and the memory subsystem 220. The memory subsystem 220 is constructed of the synchronous DRAMs 221 to 228 having the memory structures shown in FIG. 8. As a result, this memory subsystem 220 can be constituted as a multi-bank type memory subsystem with employment of a small number of structural components, as compared with such a memory subsystem with using asynchronous DRAMs.

The memory control apparatus 210 is provided with the control circuit 211 for allocating the memory access request to two sets of RAMs. 4 sets of synchronous DRAMs selected from the synchronous DRAMs 221 to 228 are connected to each of the memory subsystems 220 for the interfacing function. In this case, the addressing method is given as described in an internal portion of the memory subsystem 220. That is, the addresses are allocated in such a manner that the DRAM accessed every word address is shifted. On the other hand, this approach does not constitute the optimum solution, namely this approach corresponds to a general allocation method used to process an 8-byte single access. The reason why this approach does not constitute the optimum solution is given as follows:

In general, as described in the above-explained publication 2, the pseudo-vector processor sequentially executes the iteration which constitutes the DO loop. As a consequence, since one vector operand is not continuously access, like a general vector processor, either the main memory or the memory subsystem functioning as the lower hierarchy is accessed in the discontinuous manner. In other words, the access operation in this case constitutes such an access patterns as [a(i+2)→b(i+2)→a(i+3)→b(i+3)], as indicated in FIG. 4 of the publication 2. Even when the vector "a" and the vector "b" are held in the continuous region, the access addresses for the memory system are not continued.

On the other hand, the micro vector processor described in the above-explained publication 3 executes the multi-thread process operation in the vector instruction level. Also, in this vector processor, the access operations corresponding to the vector operands of the plural streams are present in a mixture manner. As a result, also in this case, even when the operands of the respective streams are allocated to the continuous region, the access addresses with respect to either the main memory or the memory subsystem of the lower hierarchy are not continued. This may constitute the major reason why the approach shown in FIG. 8 is not the optimum approach.

Furthermore, the above-explained UMA (unified memory access) in the publication No. 4 may have a similar architecture to the above-described architecture such that a plurality of memory access streams are produced.

As previously explained, such a memory system that the high throughput is required, although the addresses of memory access operations are not continued, must necessarily employ the memory structure with employment of large numbers of memory banks except for this memory system that a large number of highspeed RAMs available in use of cache memories is employed. This reason is given as follows even when the fine processing technique of the semiconductor process could be advanced, the performance of memory cells used in various types of DRAMs could not be greatly improved. If the continuous access operation could not be realized in RAMs, then DRAMs could not be operated in high speeds. In other words, since the synchronous DRAM is employed, the RAM interface portion of the memory system can be operated in high speeds. However, when the access operation is required for the not continued addresses, there is no solution capable of accepting the requirement of the processor side other than increasing of the banks.

As a result, in the data processing apparatus requiring such highspeed data process operations, either the main memory or the memory subsystem of the lower hierarchy, which is arranged by the multi-bank, must be prepared. This would cause a serious/essential problem, namely the total component quantity of the system could not be reduced, as compared with the compactness of the processor. This aspect will now be explained with reference to FIG. 8.

In a conventional data processing apparatus shown in FIG. 8, it is now assumed that a stream 201 of a continuous address (a0, a1, a2, a3, - - - ) is mixed with a stream 202 of another continuous address (b0, b1, b2, b3, - - -) issued from an instruction processor 200. Then, another assumption is made that an arrangement of these continuous addresses on a memory subsystem is described inside a memory subsystem 220.

In the above case, the stream 201 is mixed with the stream 202 by a multiplexer 203, and then the mixed address stream is directly supplied to a memory control apparatus 210 so as to be processed therein. As explained above, when accesses are mixed with each other, the resulting access mode is approximated to the random mode with respect to the memory system. As a result, the feature of DRAM which can accept the continuous access cannot be accomplished. For example, when the cycle time of the DRAM is equal to 8 machine cycles, 8 banks must be prepared as the minimum quantity in order to respond to the access request issued from the processor every cycle.

As previously explained, there is a certain possibility that the addresses of the memory access operations within the processor can be made continuous. However, the reason why the addresses with respect to either the main memory or the memory subsystem of the lower hierarchy are made discontinuous is given as follows. That is to say, the access requests are issued by mixing the elements of the plural vector operand streams with each other. This element mixture itself is required for the processing method capable of performing the highspeed data processing operation within the processor. Therefore, it is no meaning to consider the method for capable of avoiding this element mixture. As a result, as the memory subsystem, such a method capable of extracting the continuity of access requests from the access requests issued in the discontinuous manner can satisfy the requirement of realizing the highspeed processor.

This conventional highspeed operation idea is described in JP-A-7-262083. That is, this patent application is related to such a DRAM that a plurality of data register arrays are provided within this DRAM in correspondence with the row, and this DRAM is equipped with the mechanism for holding the access data in correspondence with the different row addresses at the same time.

In addition, the system called as "Virtual Channel Memory" has been proposed in 1997. This virtual channel memory system may largely improve the effective bandwidth in such a manner that a plurality of cache regions corresponding to the row data called as "channel" are provided between the memory cell array and the circuit for the external interface, and these plural channels are allocated to a plurality of controllers which access to the memory. This virtual channel memory system is described more in detail in Japanese magazine "NIKKEI MICRODEVICE" entitled "Virtual Channel Memory - - - effective in plural memory masters" issued in February 1998, pages 142 to 129 (will be referred to as a "publication No. 5" hereinafter).

SUMMARY OF THE INVENTION

As previously explained in JP-A-7-262083, when the plural sets of data registers are provided in correspondence with the rows as the cache memory, there is such a problem that the data transfer capability within the DRAM chip is deteriorated. In this case that while a sense amplifier is recognized as a simple buffer, and this sense amplifier corresponds to a cell provided in a chip of a general-purpose DRAM, a mechanism capable of reading out data appearing on this sense amplifier is realized, all of the data appearing on the sense amplifier need not be moved within the DRAM chip.

However, in such a case that data corresponding to a row are held in plural planes of buffers, the data appearing on this sense amplifier must be transferred. At this time, there is such a problem that the data transfer capability within the DRAM chip is lowered. In general, data lines from sense amplifiers to I/O buffers are commonly used among a plurality of cells (separate data bits designated by same row addresses). This reason is given as follows That is, if the I/O data lines are not commonly used, then power consumption of the DRAM is increased, and furthermore, the area occupied by the circuits operable in relatively high speeds is increased. For instance, in the case that a bit number per row is equal to 1024 bits, when this data is transferred from a sense amplifier to a data register array within one access operation (during 10 ns), this data transfer capability would become necessarily 100 Gb/s. If a DRAM is arranged by an n-bit width structure, then the overall DRAM chip would require the transfer capability of n×100 Gb/s (for example, if N=16, then, 200 G byte/sec.). Such a high data transfer capability of DRAM can be hardly and practically realized. Such a reading system circuit method from the memory cells is described in Japanese book "ULTRA LSI MEMORY" written by K. ITO, published by BAIFUKAN, on pages 161 to 173 (will be referred to as a "publication No. 6" hereinafter).

On the other hand, when the above-described data for one access operation are subdivided and the subdivided data portions are transferred, there are large demerits in the performance. That is, while these subdivided data portions are transferred, no access operation cannot be carried out for this memory cell.

Furthermore, since a large number of memory devices are used in a system, structures of these memory devices are not specific to a specialized system. Therefore, these memory devices are preferably required to be commonly used among various sorts of systems. If this memory structure could not be realized, then such a memory device is not commercially acceptable, namely becomes very expensive, even when a high performance memory device could be realized in a certain system of a specific field. As a result, system competition (cost-to-performance ratio) would be greatly deteriorated.

Furthermore, the VCM (Virtual Channel Memory) system owns the following restrictions. That is, in this VCM system, the data width per channel is fixed, and the data transfer amount from the memory cell to the channel can be designated. However, there is such a restriction that a total channel number prepared by a chip is limited. Even when a certain area is secured for channels, if both the channel total number and the data width are fixed, then there is a serious limitation that this VCM memory is applied to various sorts of systems.

In the case that the VCM system is arranged by employing a small number of channels having a large data width as to such a utilization that a smaller data width per channel is better and a large number of channels is better, the memory area for the channels which has been previously prepared could not be effectively utilized. Also, since a total channel number becomes short, the performance of this. VCM memory could not be sufficiently achieved. Also, in the case that the VCM system is arranged by employing a large number of channels having a small data width as to such a utilization that a larger data width per channel is better and a small total number of channels is better, the following problems occur. That is, the overhead of the managing circuit for managing the memory is increased, and also, the data transfer operation to the channel frequently occurs, resulting in a deterioration of the data transfer efficiency.

An object of the present invention has been made to solve these various problems of the related art, and therefore, is to provide a memory device capable of flexibly accepting requirements of a necessary data width, and a necessary channel number. Also, the object of the present invention is to provide such a system capable of optimizing performance thereof and management cost thereof by arranging a memory subsystem with use of such a memory device even in such a process operation for processing an access address issued from a request source to this memory subsystem when a plurality of essentially continuous streams are mixed with each other. Also, another object of the present invention is to provide such a memory device capable of covering various systems defined form a personal-used system up to a large-scaled technical calculation system.

The above-explained objects of the present invention can be achieved by employing the below-mentioned memory device. That is, in order that a register array is provided which has a specific structure where a position for holding data may be specified by using an absolute register number and an absolute word number within this memory device, and a virtual register array is constituted on the register array, and also this virtual register array is made of "S×N-structured register", the size of which is "S" words and which is arranged by N sets of registers, this memory device is comprised of: a mode register for defining the register size "S" and the register number "N"; and a converting circuit for converting both a virtual register number and a virtual word number, which are applied from an external circuit provided outside this memory device, into both an absolute register number and an absolute word number by using the value held in the mode register.

It should be understood that information may be arbitrarily set from the external circuit provided outside the memory device with respect to the above-explained mode register.

BRIEF DESCRIPTION OF THE DRAWINGS

For a better understanding of the present invention, reference is made of a detailed description to be read in conjunction with the accompanying drawings, in which:

FIG. 2 is a time chart for explaining operation of the memory device when a read operation is performed;

FIG. 4 is a time chart for explaining operation of the memory device when a write operation is carried out;

FIG. 5 is a time chart for explaining operation of the memory device when a write operation is carried out;

FIG. 7 illustratively represents formulae used to describe a method for acquiring an absolute register number/absolute word number from a virtual register number/virtual word number;

FIG. 9 is a schematic block diagram for indicating the structure of the conventional synchronous DRAM.

DESCRIPTION OF THE EMBODIMENTS

Referring now to drawings, a memory device according to an embodiment mode of the present invention will be described in detail.

Figure 1:
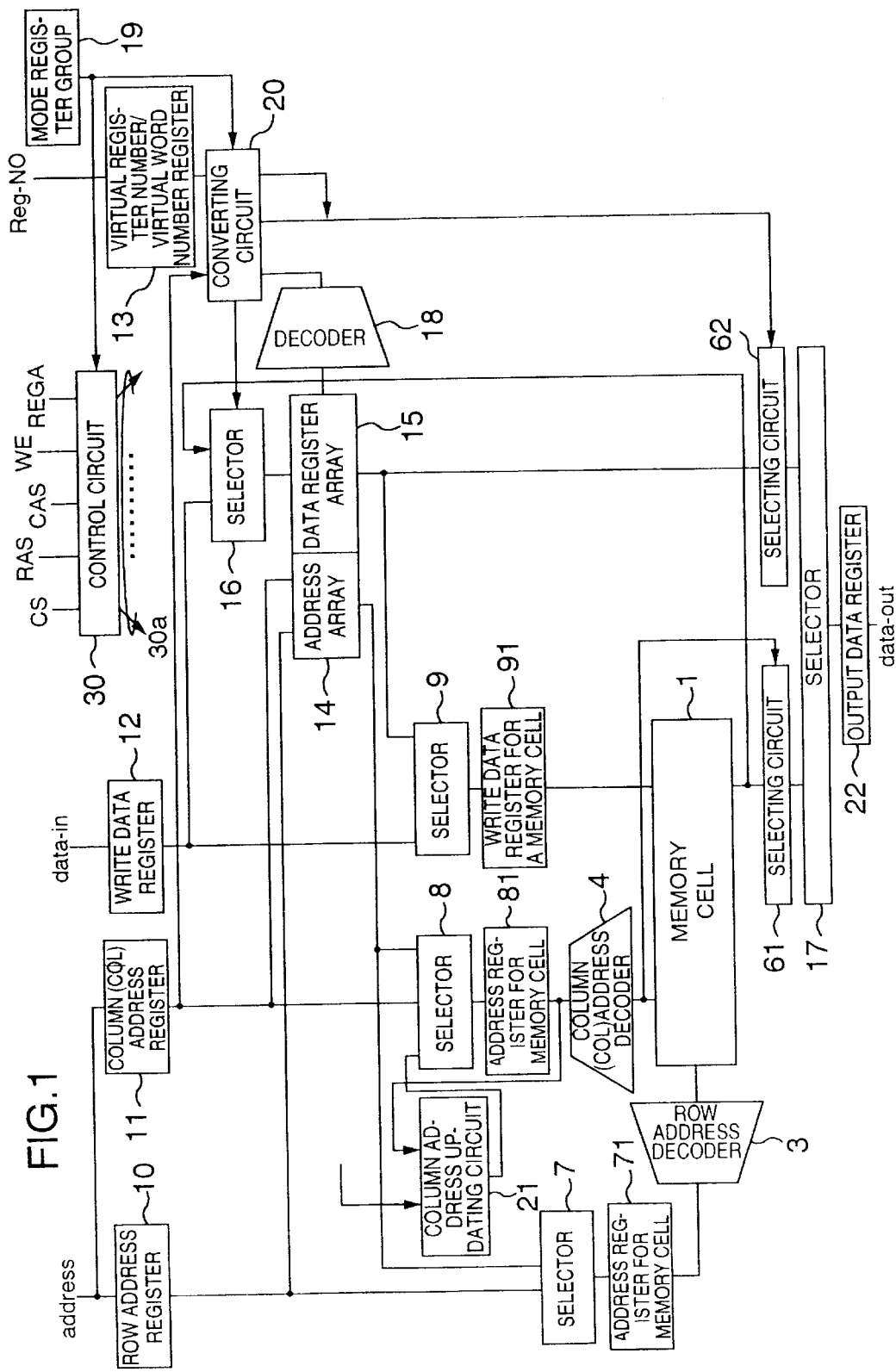
FIG. 1 is a block diagram for schematically indicating a structure of a memory device according to an embodiment mode of the present invention.

FIG. 1 is a block diagram for schematically representing a structure of a memory device according to one embodiment mode of the present invention. In FIG. 1, reference numeral 1 shows a memory cell; reference numeral 3 indicates a row address decoder; reference numeral 4 represents a column (COL) address decoder; reference numerals 7 to 9, 16, and 17 are selectors; and reference numeral 10 indicates a row address register. Also, numeral 11 indicates a column (COL) address register; numeral 12 denotes a write data register; numeral 13 shows a virtual register number/virtual word number register; numeral 14 shows an address array; numeral 15 represents a data register array; numeral 18 represents a decoder; numeral 19 indicates a mode register group; and numeral 20 shows a converting circuit. Further, numeral 21 indicates a column address updating circuit; numeral 22 shows an output data register; numeral 30 denotes a control circuit; numerals 61 and 62 are selecting circuits; numerals 71 and 81 represent address registers for memory cells; and numeral 91 shows a write data register for a memory cell.

The memory device shown in FIG. 1 corresponds to such a RAM (random access memory) to which the present invention is applied. The memory device is provided with the memory cell 1 for constituting a memory cell array; the data register array 15 having the variable structure and equipped with a plurality of registers for storing there into a duplication of a data portion of data held in the memory cell 1; the address array 14 having a plurality of entries corresponding to the respective registers, for holding positional information (address) of the data within the memory cell 11, stored in the respective registers of the data register array 15; and the selector 17 for selecting the output derived from the data register array 15 and the output derived from the memory cell 1. Also, the memory device of FIG. 1 is further constituted by the output data register 22; the selector 16 for selecting data written into the data register array 15; the selector 16 for selectively switching the externally supplied write data and the output from the data register array 15; the write data register 91 for the memory cell; the selectors 8 and 9 for selectively switching the externally supplied address and the output from the address array 14; and the row address register 71 for the memory cell 1. Further, this memory device of FIG. 1 is arranged by the column address register 81 for the memory cell; the row address decoder 3; the column address decoder 4; the row address register 10; the column address register 11; the write data register 12; the virtual register number/virtual word number register 13; the converting circuit 20 for converting a virtual register number/virtual word number into an absolute register number/absolute word number; the mode register group 19 for holding such information used to convert the above-described virtual register number/virtual word number into the absolute register number/absolute word number; the decoder 18 for accessing the data register array 15; the column address updating circuit used in such a case that the divided data is transferred from the memory cell 1 to the data register array 15; and also the control circuit 30 for issuing a control signal 30a and the like to the respective registers and the respective selectors. Furthermore, the memory device is provided with an address input terminal into which an address signal (row address and column address) is supplied from an external circuit; a data-in terminal into which a data signal (write data) is supplied from an external circuit; a Reg-NO input terminal into which a Reg-NO (Register Number) signal is supplied from an external circuit; a control signal input group; and also a data out terminal for outputting a data signal to an external circuit. Into the control signal input terminal group, various control signals such as CS (Chip Select)/RAS (Row Address Strobe)/CAS (Column Address Strobe)/WE (Write Enable)/ REGA (data REGister array Access) signals are supplied from the external circuit.

As variations of operations related to "READ" and "WRITE" with respect to the memory device shown in FIG. 1, the following items may be conceived:

Variation of READ Operation:
(1) Reading operation from memory cell while no data is registered into data register array;
(2) Reading operation from memory cell while data is registered into data register array; and
(3) Reading operation from data register array.

Variation of WRITE Operation:
(1) Writing operation into memory cell (no access to data register array);
(2) Writing operation into both memory cell and data register array;
(3) Updating operation of data held in data register array (no access to memory cell); and
(4) Rewriting operation from data register array into memory cell.

Next, a reading operation and a writing operation of the memory device according to one embodiment mode of the present invention will now be described with reference to FIG. 2 to FIG. 5. It should be understood that time charts indicated in FIG. 2 to FIG. 5 are represented by interface signals of the RAM.

Figure 3:
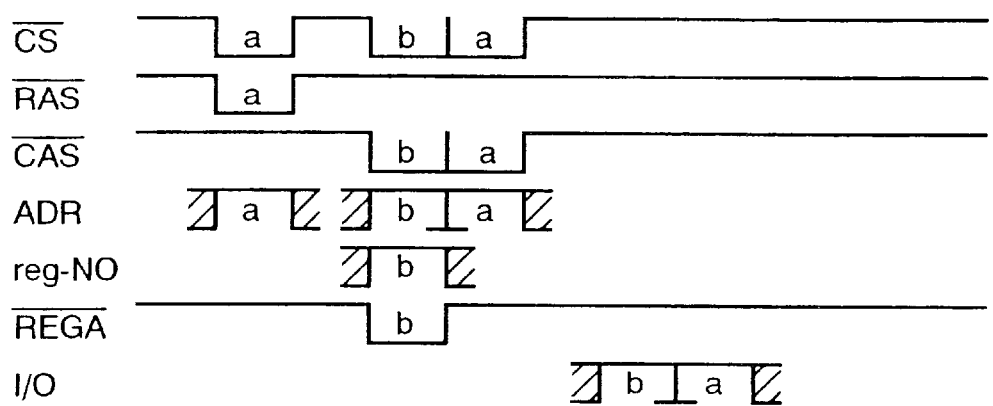
FIG. 3 is a time chart for explaining operation of the memory device when a read operation is performed.

FIG. 2 and FIG. 3 are time charts for explaining operations of the memory device when the reading (READ) operation is carried out, whereas FIG. 4 and FIG. 5 are time charts for explaining operations of the memory device when the writing (WRITE) operation is carried out.

First, a description of the READ operation is made with reference to FIG. 2.

A time chart shown in FIG. 2(a) represents a reading operation from the memory cell 1 executed in such a case that no data is registered into the data register array 15 (will be referred to as a "first READ operation" hereinafter). In this reading operation, a set signal 30a is produced by the control circuit 30 in response to a CS/RAS signal supplied from a circuit located outside this memory device. This set signal 30a is supplied to the row address register 10, and a row address supplied from a circuit positioned outside this memory device is acquired into this row address register 10. The acquired row address is further acquired via the selector 7 into the row address register 71 for the memory cell, and is transferred from the row address register 71 for the memory cell to the row address decoder 3. The row address is decoded by the row address decoder 3. The decoded row address is supplied to the memory cell 1, and a reading operation of row data is initiated. This row data is read out from an area designated by the row address on the memory cell 1. The row data read by the initiated reading operation is sent to the selecting circuit 61.

On the other hands, a set signal 30a is produced by the control circuit 30 in response to a CS/CAS signal supplied from a circuit located outside this memory device. This set signal 30a is supplied to the column address register 11, and a column address supplied from a circuit positioned outside this memory device is acquired into this column address register 11. The acquired column address is further acquired via the selector 8 into the column address register 81 for the memory cell, and is transferred from the column address register 81 for the memory cell to the column address decoder 4. The column address is decoded by the column address decoder 4. The decoded column address s supplied to the selecting circuit 61 located in a down stream of the memory cell.

In the selecting circuit 61, a retrieve operation is made of such data designated by the column address which is supplied from the column address decoder 4 among the read row data, so that read data is selected. The selected read data is supplied to the selector 17.

Under such a condition that the RAM is accessed in combination with the CS/RAS signal, a selection instructing signal is produced by the control circuit 30 and then supplied to the selector 17. This selection instructing signal instructs a selection of output data from the selecting circuit 61. As a result, in the selector 17, the read data sent from the selecting circuit 61 is selected to be supplied to the output data register 22. The data outputted from the selector 17 is set to the output data register 22. Thereafter, this output data is derived from the output data register 22 to a circuit provided outside the memory device.

With execution of the above-described operations, the first READ operation is accomplished.

A time chart shown in FIG. 2(b) represents another reading operation from the memory cell 1 executed in such a case that data is register into the data register array 15 (will be referred to as a "second READ operation" hereinafter). Similar to the first READ operation, in this second READ operation, data is read out from the memory cell 1. This second READ operation is different from the above-explained first READ operation as to the following point: In response to both a REGA signal and a Reg-NO signal which are simultaneously supplied in combination with a CAS signal from an external circuit, 1 word data (namely, word length indicated in mode register group 19) is stored at a register number position of the data register array 15 designated by the Reg-NO signal.

Similar to the first READ operation, both a CS/RAS signal and a row address are firstly supplied to the memory device from an external circuit, so that a row address is acquired into the row address register 10. Also, both a CS/CAS signal and a column address are supplied into the memory device, and then the column address is acquired into the column address register 11.

At this time, a set signal 30a is produced from the control circuit 30 in response to the REGA signal which is externally supplied at the same time together with the CS/CAS signal. This set signal 30a is supplied to the virtual register number/virtual word number register 13, and the Reg-NO signal externally supplied to the memory device is acquired by the virtual register number/virtual word number register 13. The Reg-No signal corresponds to such a signal for designating the numbers of the respective registers (virtual register number) provided in the data register array which is virtually constituted on the data register array 15.

The Reg-NO signal is sent from the virtual register number/virtual word number register 13 to the converting circuit 20. In this converting circuit 20, the virtual register number which is designated by the supplied Reg-NO signal is converted into an absolute register number, and then, this absolute register number is transferred to the decoder 18. The absolute register number corresponds to information used to designate any one of the registers employed in the data register array 15. The absolute register number is decoded by the decoder 18, and then, the decoded absolute register number is supplied to the data register array 15. In the data register array 15, a selection is made of one register having such a register number designated by the absolute register number.

On the other hand, the column address contains information for designating more than one number of each of words (virtual word/number) stored into each of the registers of the data register array virtually arranged on the data register array 15. Then, the virtual word number information contained in the column address acquired in the column address register 11 is transferred to the converting circuit 20. The virtual word number designated by the transferred information is converted into an absolute word number by this converting circuit 20, and then the absolute word number is supplied to the selector 16. The absolute word number is supplied from the selector 16 to the data register array 15. In the data register array 15, a region designated by the absolute word number is selected from the register designated by the absolute word number.

It should be noted that in this embodiment mode, the virtual word number information is supplied as a portion of the column address from the external circuit via the address input terminal of the memory device to this memory device. Alternatively, the virtual word number information may be directly supplied to this memory device from the external circuit via another input terminal of the memory device different from the above-explained address input terminal provided in the memory device. This alternative supply of the virtual word number information may be similarly applied to the below-mentioned description.

Similar to the first READ operation, both the row address and the column address are supplied to the memory cell 1. In the memory cell 1, a region designated by the row address and the column address are selected, and then, data is read out from this selected region. The read data is supplied to the selector 16.

The control circuit 30 produces a selection instructing signal for instructing the selector 16 to select the data read out from the selector 16 in response to a CS/CAS/REGA signal externally supplied thereto. The selector 16 selects any one of the data read from the memory cell 1 and the write data sent from the write data register 12. The control circuit 30 supplies this selection instructing signal to this selector 16. Also, the control circuit 30 produces a write instructing signal in response to a WE signal which is supplied at the same time together with the above-explained CS/CAS/REGA signal, and then, supplies this write instructing signal to the data register array 15.

In response to the selection instructing signal supplied from the control circuit 30, the selector 16 selects the data read out from the memory cell 1 to supply this selected data to the data register array 15.

In the data register array 15, the data supplied from the selector 16 is stored into such a region which is selected by both the absolute register number and the absolute word number in response to the write instructing signal.

It should also be noted that in the above-described operation, when the absolute register number is supplied to the data register array 15, such a register designated by the absolute register number is selected in the data register array 15, and furthermore, an entry corresponding to the selected register within the data register array 15 is selected in the address array 14. Also, both the row address and the column address which are acquired into the row address register 10 and the column address register 11 are supplied to the converting circuit 20 and also to the address array 14. Then, the supplied row address and column address are registered into the selected entry of the address array 14 in conjunction with such an operation that the write data is stored into the selected register of the data register array 15.

Also, the data read from the memory cell 1 is selected by the selector 17 in parallel to the storage operation to the data register array 15, and then the selected data is set to the output data register 22. Thereafter, the data is outputted from the output data register 22 of the memory device to the external circuit, which operation is identical to that of the first READ operation.

With execution of the above-described operations, the second READ operation is accomplished.

A time chart indicated in FIG. 2(c) indicates a reading operation executed when data is read out from the data register array 15 (will be referred to as a "third READ operation" hereinafter). It is now assumed that data to be read in this reading operation is such data which has been registered into the data register array 15 by the previously explained second READ operation and a second WRITE operation (will be discussed later). This reading operation is commenced by such an operation that a RAS signal is not supplied to the memory device, but a CS/CAS/REGA signal is supplied to the memory device.

In response to the CS/CSA/REGA signal, the control circuit 30 produces a set signal 30a. This set signal 30a is supplied to the column address register 11 and the virtual register number/virtual word number register 13. A column address which is externally supplied by this set signal 30a is acquired into the column address register 11, and a Reg-NO signal is acquired into the virtual register number/virtual word number register 13.

The Reg-NO signal is sent from the virtual register number/virtual word number register 13 to the converting circuit 20. In this converting circuit 20, the virtual register number which is designated by the supplied Reg-NO signal is converted into an absolute register number, and then, this absolute register number is transferred to the decoder 18. The absolute register number is decoded by the decoder 18, and then, the decoded absolute register number is supplied to the data register array 15. In the data register array 15, a selection is made of one register having such a register number designated by the absolute register number, and the reading operation of such data held in this register is initiated. The data read from this register by the initiated read operation is sent to the selecting circuit 62.

On the other hand, virtual word number information within the column address, acquired into the column address register 11 is sent from the column address register 11 to the converting circuit 20. The virtual word number designated by the sent information is converted into an absolute word number by the converting circuit 20, and then, the converted absolute word number is supplied to the selecting circuit 62.

The selecting circuit 62 selects such data designated by the absolute word number supplied from the converting circuit 20 among the data read from the data register array 15. The selected data is supplied to the selector 17.

Also, a selection instructing signal is supplied from the control circuit 30 to the selector 17, and this selection instructing signal instructs to select the data outputted from the selecting circuit 62. As a result, the data sent from the selecting circuit 62 is selected by the selector 17 to be set to the output data register 22. Thereafter, the data is outputted from the output data register 22 of the memory device to the external circuit.

With execution of the above-described operations, the third READ operation is accomplished.

In the above-described READ operations according to the embodiment mode of the present invention, even when the access operation to the memory cell 1 is not yet completed, the access operation to the data register array 15 may be carried out. A time chart shown in FIG. 3 indicates such a case that such an access operation to the memory cell 1 and another access operation to the data register array 15 are executed in a parallel manner. In this time chart, a portion indicated by symbol "a" corresponds to the first READ operation (access operation to memory cell 1), and a portion indicated by symbol "b" corresponds to the third READ operation (access operation to data register array 15).

In FIG. 3, since both a CS/RAS signal and a row address are supplied to the memory device, the first READ operation denoted by symbol "a" is commenced. The row address is sent from the row address register 10 via the selector 7 to the row address register 71 for the memory cell, and thereafter, is held in the row address register 71 for the memory cell. Then, the row address is decoded by the row address decoder 3, and the decoded row address is supplied to the memory cell 1, so that the data reading operation is initiated.

On the other hand, after two cycles have passed when this data reading operation is initiated, a CS/CAS/REGA signal, a Reg-NO signal, and also a column address with respect to the data register array 15 are supplied to the memory device, so that the third READ operation indicated: by symbol "b" is commenced. Both the Reg-NO signal supplied at this time, and virtual word number information contained in the column address supplied at this time are sent from the virtual register number/virtual word number register 13 and the column address register 11, respectively, to the converting circuit 20. Then, the Reg-NO signal and the virtual word number information are converted into an absolute register number and an absolute word number by the converting circuit 20. The absolute register number is decoded by the decoder 18 to be supplied to the data register array 15, so that the data reading operation is initiated. Also, the absolute word number is supplied to the selecting circuit 62.

After one cycle when the third READ operation is commenced, both the CS/CAS signal and the column address appearing in the first READ operation are supplied to the memory device. At this time, the column address is supplied from the column address register 11 via the selector 8 to the column address register 81 for the memory cell so as to be held in this column address register 81. Then, the column address is decoded by the column address decoder 4, and the decoded column address is supplied to the selecting circuit 61.

In this case, the third READ operation is commenced after the first READ operation. The supply of the absolute word number with respect to the selecting circuit 62 is carried out in advance, as compared with the supply of the column address with respect to the selecting circuit 61. The selection of the read data from the selecting circuit 62 is carried out prior to the selection of the read data from the selecting circuit 61, and then, the data read out from the selecting circuit 62 is outputted. As a result, the read data by the third READ operation is outputted via the output data register 22 from the memory device earlier than the read data by the first READ operation.

As previously explained, the third READ operation may be commenced while the first READ operation is carried out, namely while the access operation with respect to the memory cell 1 is performed. This reason is given as follows: The row address register 71 for the memory cell is prepared independent from the row address register 10. The row address which has been previously supplied is sent from the row address register 10 to the row address register 71 for the memory cell, and is held in the row address register 71 for the memory cell until the access operation for the memory cell is accomplished. In other words, even when the memory cell accessing operation is carried out in response to the previously supplied row address, the row address need not be continuously held in the row address register 10, but the content thereof may be changed. As a result, the READ (otherwise WRITE) operation can be commenced by employing the row address register 10 without waiting for the completion of the memory access operation. Also, as to the column address, since the column address register 81 for the memory cell is prepared independent from the column address register 11, the READ (otherwise, WRITE) operation with respect to the data register array 15 can be similarly commenced even while the memory access operation is carried out.

Also, since such address registers 71 and 81 for the memory cell are. employed, the accessing sequence may be reversed (passing over) between the memory cell access operation and the data register array access operation.

Next, a description of the WRITE operation is made with reference to FIG. 4 and FIG. 5.

A time chart shown in FIG. 4(*a*) represents a writing operation into the memory cell 1 executed in such a case that no access operation is performed to the data register array 15 (will be referred to as a "first WRITE operation" hereinafter). In this writing operation, a set signal 30*a* is produced by the control circuit 30 in response to a CS/RAS signal supplied from an external circuit located outside this memory device. This set signal 30*a* is supplied to the row address register 10, and a row address supplied from an external circuit positioned outside this memory device is acquired into this row address register 10. The acquired row address is further acquired via the selector 7 into the row address register 71 for the memory cell, and is transferred from the row address register 71 for the memory cell to the row address decoder 3. The row address is decoded by the row address decoder 3. The decoded row address is supplied to the memory cell 1. In the memory cell 1, such a row region designated by the row address is selected.

Subsequently, a set signal 30*a* is produced by the control circuit 30 in response to a CS/CAS signal supplied from an external circuit located outside this memory device. This set signal 30a is supplied to the column address register 11, and a column address supplied from an external circuit positioned outside this memory device is acquired into this column address register 11. The acquired column address is further acquired via the selector 8 into the column address register 81 for the memory cell, and is transferred from the column address register 81 for the memory cell to the column address decoder 4. The column address is decoded by the column address decoder 4. The decoded column address is supplied to the memory cell 1. In this memory cell 1, a selection is made of such a column region designated by the column address among the row region designated by the row address.

Also, the set signal 30a produced by the control circuit 30 is also supplied the write data register 12, and then, write data which is supplied from an external circuit to the memory device is acquired into the write data register 12. The acquired write data is further acquired via the selector 9 into the write data register 91 for the memory cell, and then, is supplied from the write data register 91 for the memory cell to the memory cell 1.

Furthermore, in response to a WE signal externally supplied to the memory device, the control circuit 30 produces a write instructing signal and then supplies this write instructing signal to the memory cell 1.

In the memory cell 1, in response to the write instructing signal supplied from the control circuit 30, the write data supplied from the write data register 91 for the memory cell is written into such a region selected by the row address and the column address.

With execution of the above-described operations, the first WRITE operation is accomplished.

A time chart shown in FIG. 4(b) represents another writing operation into the memory cell 1 and also the data register array 15 (will be referred to as a "second WRITE operation" hereinafter). Similar to the first WRITE operation, in this second WRITE operation, data is written into the memory cell 1. This second WRITE operation is different from the above-explained first WRITE operation as to the following point: While data is written into the memory cell 1, the same data is written into the data register array 15 in parallel thereto.

Similar to the first WRITE operation, both a CS/RAS signal and al row address are firstly supplied to the memory device from an external circuit, so that the row address is acquired into the row address register 10. Also, both a CS/CAS signal and a column address are supplied into the memory device, and then the column address is acquired into the column address register 11. Furthermore, write data is also supplied to the memory device, and then is acquired into the write data register 12.

At this time, a set signal 30a is produced from the control circuit 30 in response to the REGA signal which is externally supplied at the same time together with the CS/CAS signal. This set signal 30a is supplied to the virtual register number/virtual word number register 13, and the Reg-NO signal externally supplied to the memory device is acquired by the virtual register number/virtual word number register 13. This signal acquiring operation is carried out at the same timing when the column address is acquired into the column address register 11.

Similar to the first WRITE operation, both the row address and the column address are supplied to the memory cell 1. In the memory cell 1, such a region designated by the row address and the column address is selected.

The Reg-NO signal is sent from the virtual register number/virtual word number register 13 to the converting circuit 20. In this converting circuit 20, the virtual register number which is designated by the supplied Reg-NO signal is converted into an absolute register number, and then, this absolute register number is transferred to the decoder 18. The absolute register number is decoded by the decoder 18, and then, the decoded absolute register number is supplied to the data register array 15. In the data register array 15, a selection is made of such a register designated by the absolute register number.

Then, the virtual word number information contained in the column address acquired into the column address register 11 is also transferred to the converting circuit 20. The virtual word number designated by the transferred information is converted into an absolute word number by this converting circuit 20, and then the absolute word number is supplied to the selector 16. The absolute word number is supplied from the selector 16 to the data register array 15. In the data register array 15, a word region designated by the absolute word number is selected from the register designated by the absolute word number.

The write data acquired into the write data register 12 is supplied via both the selector 9 and the write data register 91 for the memory cell to the memory cell 1, and is supplied to the selector 19 in parallel thereto.

The control circuit 30 produces a selection instructing signal for instructing the selector 16 to select the data read out from the write data register 12 in response to a CS/CAS/REGA signal externally supplied thereto. The control circuit 30 supplies this selection instructing signal to this selector 16. Also, the control circuit 30 produces a write instructing signal in response to a WE signal which is supplied at the same time together with the above-explained CS/CAS/REGA signal, and then, supplies this write instructing signal to both the data register array 15 and the memory cell 1.

In response to the selection instructing signal, the selector 16 selects the data supplied from the write data register 12 to supply this selected data to the data register array 15.

In the data register array 15, the write data supplied from the selector 16 is stored into such a region which is selected by both the absolute register number and the absolute word number in response to the write instructing signal. While the write data is stored into this data register array 15, the same write data is written into the memory cell 1 in parallel thereto.

It should also be noted that in the above-described operation, when the absolute register number is supplied to the data register array 15, such a register designated by the absolute register number is selected in the data register array 15, and furthermore, an entry corresponding to the selected register within the data register array 15 is selected in the address array 14. Also, both the row address and the column address which are acquired into the row address register 10 and the column address register large supplied to the converting circuit 20 and also to the address array 14. Then, the supplied row address and column address are registered into the selected entry of the address array 14 in conjunction with such an operation that the write data is stored into the selected register of the data register array 15.

With execution of the above-described operations, the second WRITE operation is accomplished.

A time chart indicated in FIG. 4(c) indicates an updating operation of data for the data register array 15 while an access operation is not performed (will be referred to as a "third WRITE operation" hereinafter). It is now assumed that data to be updated in this updating operation is such data which has been registered into the data register array 15. Therefore, the subject data is previously registered into this array 15 by the previously explained second READ operation and the second WRITE operation.

This third WRITE operation is commenced by such an operation that a RAS signal is not supplied to the memory device, but a CS/CAS/REGA signal is supplied to the memory device.

In response to the CS/CSA/REGA signal, the control circuit 30 produces a set signal 30a. This set signal 30a is supplied to the column address register 11 and the virtual register number/virtual word number register 13. A column address which is externally supplied by this set signal 30a is acquired into the column address register 11, and a Reg-NO signal is acquired into the virtual register number/virtual word number register 13.

Also, the set signal 30a is supplied to the write data register 12, and update data which is supplied from an external circuit to the memory device is acquired into the write data register 12.

A Reg-NO signal which is acquired into the virtual register number/virtual word number register 13 is sent from this virtual register number/virtual word register 13 to the converting circuit 20. In this converting circuit 20, the virtual register number which is designated by the supplied Reg-NO signal is converted into an absolute register number, and then, this absolute register number is transferred to the decoder 18. The absolute register number is decoded by the decoder 18, and then, the decoded absolute register number is supplied to the data register array 15. In the data register array 15, a selection is made of such a register designated by the absolute register number.

On the other hand, virtual word number information within the column address, acquired into the column address register 11 is sent from the column address register 11 to the converting circuit 20. The virtual word number designated by the sent information is converted into an absolute word number by the converting circuit 20, and then, the converted absolute word number is supplied to the selector 16. The absolute word number is supplied from the selector 16 to the data register array 15. In the data register array 15, a selection is made of such a word region designated by the absolute number, within the register designated by the absolute register number.

The update data acquired into the write data register 12 is set to the selector 16. In the selector 16, the update data sent from the write data register 12 is selected in response to the selection instructing signal supplied from the control circuit 30, and the selected update data is supplied to the data register array 15.

On the other hand, in the control circuit 30, a write instructing signal is produced in response to a WE signal which is supplied at the same time together with the CS/CAS/REGA signal, and this write instructing signal is supplied from the control circuit 30 to the data register array 15.

In response to the write instructing signal, the data which has been stored into the region selected by the absolute register number and the absolute word number is replaced by the update data supplied from the selector 16.

With execution of the above-described operations, the third WRITE operation is accomplished.

A time chart shown in FIG. 5(a) represents a rewriting operation from the data register array 15 to the memory cell 1 (will be referred to as a "fourth WRITE operation" hereinafter). Similar to the first WRITE operation, in this fourth WRITE operation, data is written (updated) into the memory cell 1. This fourth WRITE operation is different from the above-explained first WRITE operation as to the following point: That is to say, the data to be written into the memory cell 1 is supplied not from an external circuit, but from the data register array 15.

Similar to the first WRITE operation, both a CS/RAS signal and a row address are firstly supplied to the memory device from an external circuit, so that the row address is acquired into the row address register 10. Also, both a CS/RAS signal and a column address are supplied into the memory device, and then the column address is acquired into the column address register 11.

At this time, a set signal 30a is produced from the control circuit 30 in response to the REGA signal which is supplied at the same time together with the CS/CAS signal. This set signal 30a is supplied to the virtual register number/virtual word number register 13, and a Reg-NO signal externally supplied to the memory device is acquired into the virtual register number/virtual word number register 13. This signal acquiring operation is carried out at the same timing when the column address is acquired into the column address register 11.

Similar to the first WRITE operation, both the row address and the column address are supplied to the memory cell 1. In the memory cell 1, such a region designated by the row address and the column address is selected.

The Reg-NO signal is sent from the virtual register number/virtual word number register 13 to the converting circuit 20. In this converting circuit 20, the virtual register number which is designated by the supplied Reg-NO signal is converted into an absolute register number, and then, this absolute register number is transferred to the decoder 18. The absolute register number is decoded by the decoder 18, and then, the decoded absolute register number is supplied to the data register array 15. In the data register array 15, a selection is made of such a register designated by the absolute register number, and data is read from this selected region.

The write data acquired into the write data register 12 is supplied via both the selector 9 and the write data register 91 for the memory cell to the memory cell 1, and is supplied to the selector 9 in parallel thereto.

The control circuit 30 produces a selection instructing signal for instructing the selector 9 to select the data read out from the selector 9 in response to a CS/CAS/REGA signal externally supplied thereto. Also, the control circuit 30 produces a write instructing signal in response to a WE signal which is supplied at the same time together with the above-explained CS/CAS/REGA signal, and then, supplies this write instructing signal to the memory cell 1.

In response to the selection instructing signal supplied from the control circuit 30, the selector 9 selects the data read out from the memory cell 1 to supply this selected data to the write data register 91 for the memory cell. The read data is acquired into the data register 91 for the memory cell, and then, is supplied from this write data register 91 for the memory cell to the memory cell 1.

In the memory cell 1, in response to the write instructing signal supplied from the control circuit 30, such data which has been held in the region selected by both the row address and the column address is replaced by the write data supplied from the write data register 91 for the memory cell.

With execution of the above-explained operations, the fourth WRITE operation is accomplished.

FIG. 5(b) is a time chart for showing an updating operation with respect, to both the memory cell 1 and the data register array 15 with employment of address information within the address array 14 provided inside the memory device corresponding to the data register array 15 (will be referred to as a "fifth WRITE" operation). In this fifth WRITE operation, similar to the second WRITE operation, the data is written (updated) into both the memory cell 1 and the data register array 15. This fifth WRITE operation owns a different point from the second WRITE operation as follows: That is to say, the data to be written into the memory cell 1 is supplied not from an external circuit, but from the address array 14.

Now, in the case that the data has been held in the data register array 15, the address within the memory cell 1 of this data: has also been registered into the address array 14. As a result, while such a memory device directed to the data stored into the data register array 15 is accessed, the memory cell 1 can be accessed without supplying the row address and the column address.

Concretely speaking, while CS/RAS/CAS/REGA signals are simultaneously supplied from an external circuit to the memory device, a set signal 30a is produced from the control circuit 30 in response to these signals. This set signal 30a is supplied to the column address register 11 and the virtual register number/virtual word number register 13. Both the column address and the Reg-NO signal externally supplied to the memory device are acquired into the column address register 11 and the virtual register number/virtual word number register 13.

The Reg-NO signal is sent from the virtual register number/virtual word number register 13 to the converting circuit 20. In this converting circuit 20, the virtual register number which is designated by the supplied Reg-NO signal is converted into an absolute register number, and then, this absolute register number is transferred to the decoder 18. The absolute register number is decoded by the decoder 18, and then, the decoded absolute register number is supplied to the data register array 15 and the address array 14. In the data register array 15, a selection is made of such a register designated by the absolute register number. Also, in the address array 14, a selection is made of such an entry corresponding to the selected register within the data register array 15.

In the address array 14, both a row address and a column address, which are registered into the selected entry, are outputted from this entry, so that the row address is supplied to the selector 7 and the column address is supplied to the selector 8.

The control circuit 30 produces a selection instructing signal for instructing the selectors 7 and 8 to select the address out from the address array 14 in response to the CS/RAS/CAS/REGA signals. The selectors 7 and 8 select the address supplied from the address array 14. Then, the selected address is sent to both the row address register 71 for the memory cell and the column address register 81 for the memory cell.

Then, the data writing operations to the memory cell 1 and also the data register array 15 other than the above-explained data writing operation are carried out in a similar manner to that of the second WRITE operation. The data which has been held in the memory cell 1, and also the data which has been stored into the region selected within the data register array 15 are replaced by the externally supplied update data, so that the fifth WRITE operation is completed.

As previously explained, in the fifth WRITE operation, a total cycle number for accessing to the memory device from the external circuit is only one cycle, as compared with the second WRITE operation.

FIG. 5(c) is a time chart for showing a rewriting operation to the memory cell 1 from the data register array 15 with employment of address information within the address array 14 provided inside the memory device corresponding to the data register array 15 (will be referred to as a "sixth WRITE" operation). In this sixth WRITE operation, similar to the fourth WRITE operation, the data read out from the data register array 15 is written into the memory cell 1. It should be understood that this sixth WRITE operation owns such a different point. That is, an address supplied to the memory cell 1 is supplied not from the external circuit, but supplied from the address array 14.

Concretely speaking, while the RAS/CAS signal is not supplied, the CS/REGA signal is externally supplied to the memory device. A set signal 30a is produced from the control circuit 30 in response to these signals. This set signal 30a is supplied to the virtual register number/virtual word number register 13. In response to this set signal 30a, a Reg-NO signal supplied from an external circuit to the memory device is acquired into the virtual register number/ virtual word number register 13.

The Reg-NO signal is sent from the virtual register number/virtual word number register 13 to the converting circuit 20. In this converting circuit 20, the virtual register number which is designated by the supplied Reg-NO signal is converted into an absolute register number, and then, this absolute register number is transferred to the decoder 18. The absolute register number is decoded by the decoder 18, and then, the decoded absolute register number is supplied to the data register array 15. In the data register array 15, a selection is made of such a register designated by the absolute register number. Also, in the address array 14, a selection is made of such an entry corresponding to the selected register within the data register array 15.

In the address array 14, both a row address and a column address, which are registered into the selected entry, are outputted from this entry, so that the row address is supplied to the selector 7 and the column address is supplied to the selector 8.

The control circuit 30 produces a selection instructing signal for instructing the selectors 7 and 8 to select the address read out from the address array 14 in response to a CS/REGA signal. The selectors 7 and 8 select the addresses supplied from the address array 14 in response to the selection instructing signal, and then supplies the selected addresses to both the row address register 71 for the memory cell and the column address register 81 for the memory cell 1.

Then, the data writing operation to the memory cell 1 and the reading operation from the data register array 15 other than the above-explained data writing/reading operations are carried out in a similar manner to that of the fourth WRITE operation, so that the sixth WRITE operation is completed.

As previously explained, in the sixth WRITE operation, a total cycle number for accessing to the memory device from the external circuit is only one cycle, similar to the fifth WRITE operation.

It should be noted that similar to the above-explained case of READ operations, in the WRITE operations according to one embodiment of the present invention, even when the access operation to the memory cell 1 is not yet accomplished, the access operation to the data register array 15 may be carried out in conjunction with the access operation to the memory cell 1.

This reason is given as follows: That is to say, as previously explained, the row address register 71 for the memory cell, the column address register 81 for the memory cell and the write data register 91 for the memory cell are prepared independent from the row address register 10, the column address register 11, and the write data register 12. Then, since such registers 71, 81, 91 for the memory cell are employed, the access sequence may be reversed (passing through) between the memory cell access operation and the data register array access operation. Furthermore, not only under such a condition that the READ operations are mixed with each other and also the WRITE operations are mixed with each other, but also such a condition that the READ operation is mixed with the WRITE operation, the memory cell access operation may be carried out in parallel to the data register array access operation. Also, the access sequence may be similarly reversed.

FIGS. 6A–6D illustratively show an example of a real structure of the data register array 15, and an example of a virtual structure thereof. Referring now to FIGS. 6A–6D, the structure of the data register array 15 will be explained.

Figure 6A:
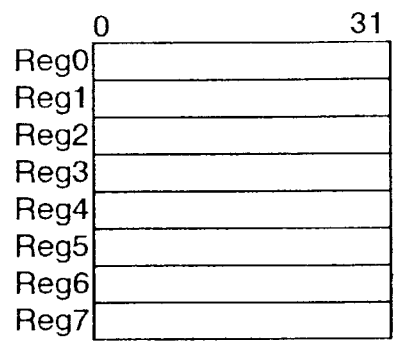
FIG. 6A to FIG. 6D are explanatory diagrams for explaining an example of a real structure of a data register array and another example of a virtual structure of this data register array.

FIG. 6A illustratively shows an example of the real structure of the data register array 15. In this example, the data register array 15 is arranged by 8 registers, and a size (namely, word length) of each of these registers is equal to 32.

Figure 6B:
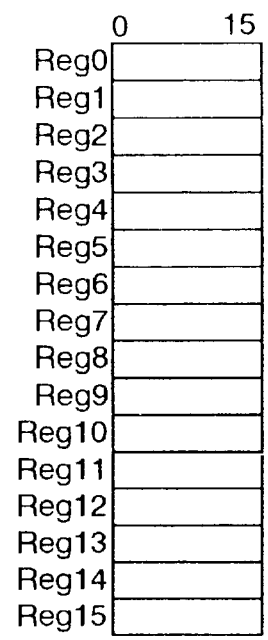

In a virtual structure 1 shown in FIG. 6B, it is now assumed that a data register array is constituted by 16 registers, and a size (i.e., word length) of each register is equal to 16.

Figure 6C:
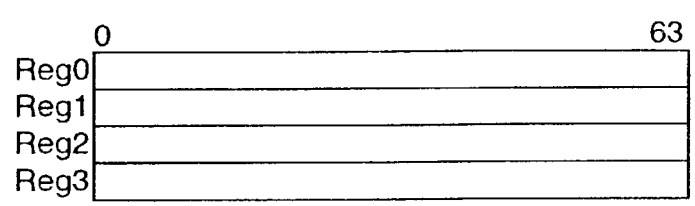

In a virtual structure 2 shown in FIG. 6C, it is now assumed that a data register array is constituted by 4 registers, and a size (i.e., word length) of each register is equal to 64.

Figure 6D:
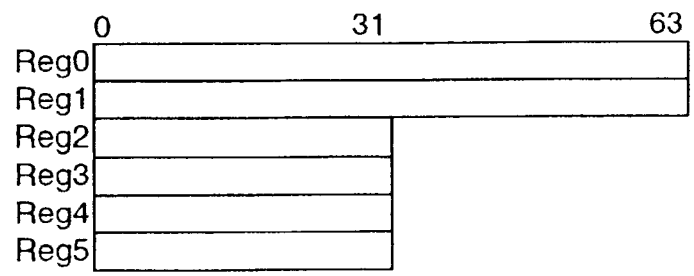

In a virtual structure 3 shown in FIG. 6D, it is now assumed that a data register array is constituted by 2 registers, and a size (i.e., word length) of each register is equal to 64, and further, constituted by 4 registers, and a size (namely, word length) of each register 10 equal to 32.

Also, in any one of the virtual structures indicated in FIG. 6B to FIG. 6D, a total capacity of the data register array, namely a value of "register size (word length)×register total number" is equal to a total capacity "32×8" of the data register array 15 having the real structure shown in FIG. 6A. In other words, the virtual structures may set within the range of the total capacity of the real structure of the data register array 15, namely, within such a value range of "register size (word length)×X register total number".

As a consequence, in such a case that a request for the memory device is issued from a large number of streams (masters), as indicated in FIG. 6B, the virtual structure may be set in such a manner that while a size (word length) per a single register is reduced, a total number of registers may be secured. On the other hand, in such a case that a request is issued from a small number of streams (masters) and also an access address is continued, as represented in FIG. 6C, such a virtual structure may be set in such a manner that while a total number of registers is reduced, a size (word length) per register is increased. Furthermore, when both of the above-explained requirements are introduced, such a virtual structure shown in FIG. 6D may be realized. Namely, it is possible to set the virtual structure in such a manner that registers having register sizes (word lengths) different from each other.

FIG. 7 illustratively represents an example of calculation formulae which are used to obtain an absolute register number/absolute word number from a virtual register number/virtual word number. Now, a description will be made of an example of a method for converting a virtual register number/virtual word number into an absolute register number/absolute word number by the converting circuit 20 shown in FIG. 1.

As indicated in FIG. 7, an absolute register number (absolute Reg #)/absolute word number (absolute W #) may be calculated from both an absolute register number (virtual Reg #) and also a virtual word number (virtual W #) designated by apportion of a column address entered from an address input terminal in such a case that a designation is made by a Reg-NO signal inputted from a Reg-NO input terminal based upon a real register size (real RS) and a virtual register size (virtual RS).

In this case, a real register size (real RS) implies such a register size of each of registers employed in the data register array 15 having the real structure. The information of this real RS is held in a register employed in the memory device not shown in FIG. 1 (will be referred to as a "real RS register"). Also, a virtual register size (virtual RS) implies a register size of each of registers provided in a virtually set virtual structure. The information of this real RS is held in any one of the registers provided in the mode register group 19. Apparently, it is possible to alternatively arrange such that the real RS is held in any one of the registers employed in the mode register group 19.

The real RS is a fixed value, and the information of the real RS is previously set to the real RS register. This setting operation may be carried out by the control circuit 30, or another circuit, for instance, when the operation of the memory device is initiated (namely, when the power supply is turned ON). To the contrary, the virtual RS is a variable value. Preferably, even when the memory device is under operation, the virtual RS may be arbitrarily set. To this end, when the virtual RS is set to the mode register group 19 of the virtual RS, the following setting operations may be realized. For example, the virtual RS may be set by either the control circuit 30 or another circuit when the operation of this own memory device is initiated (namely, power supply is turned ON). Alternatively, the predetermined virtual RS may be set from the external circuit. Also, the virtual RS which has been determined time to time at an arbitrary time instant by an application program (software) operable in a system where this memory device is used.

When the converting circuit 20 is designated based on the real RS supplied from the real RS register, the virtual RS supplied from the mode register group 19, and the Reg-NO signal supplied from the Reg-NO input terminal via the virtual register number/virtual word number register 13, this converting circuit 20 receives the virtual W #, and then calculates both an absolute Reg # and an absolute W # employing the below-mentioned formula. This virtual W # is designated by a portion of such a column address which is supplied from a virtual Reg #, address input terminal via the column address register 11.

A formula shown in FIG. 7(1) is an example of a calculation formula indicative of a method for calculating "case where virtual RS is uniform" such as the virtual structures shown in FIG. 6B and FIG. 6C. Also, a formula indicated in FIG. 7(2) is an example of a calculation formula indicative of a method for calculating "case where virtual RS is not uniform, and only one boundary where virtual RS is switched is located within virtual structure" such as shown in FIG. 6D.

As represented in (1), when the virtual RS is uniform, the absolute Reg # may be calculated as follows:

quotient of {virtual Reg #/(real $RS$/virtual $RS$)}+quotient of {virtual W #/real $RS$}.

Also, the absolute W # may be calculated as follows:

(virtual Reg #×virtual $RS$)+virtual W #−(absolute Reg #×real $RS$).

In the above-described case (2), first of all, both a virtual RS1 and another virtual RS2 are set to the mode register group 19 similar to the previous case. This virtual RS1 designates a size of such a virtual register which is located within a range where the virtual RS does not exceed the switching boundary (virtual RS boundary). The virtual RS2 designates a size of such a virtual register which is located within a range where the virtual RS exceeds the virtual RS boundary. Also, the virtual Reg # of the virtual register which is positioned immediately before the virtual RS boundary is set to the mode register group 19. For instance, as to the virtual structure shown in FIG. 6D, the virtual RS boundary is present between the virtual register whose virtual Reg # is equal to Reg 1, and the virtual register whose virtual Reg # is equal Reg 2. Then, the virtual RS1=64 of the virtual registers Reg 0 and Reg 1 which do not exceed this virtual RS boundary; the virtual RS2=32 of the virtual registers Reg 2 through Reg 5 which exceed the virtual RS boundary; and the information of the virtual Reg #=Reg 1 of such a virtual register which is positioned immediately before the virtual RS boundary are set to the mode register group 19.

The information about these virtual RS1 and RS2, and the information about the virtual Reg # are supplied from the mode register group 19 to the converting circuit 20. The converting circuit 20 compares the virtual Reg # designated by the Reg-NO signal with the virtual Reg # supplied from the mode register group # 19 in order to judge as to whether or not the virtual Reg # entered from the Reg-NO input terminal is smaller than, or equal to the virtual Reg # of such a virtual register located immediately before the virtual RS boundary. The Reg-NO signal is supplied from the Reg-NO input terminal via the virtual register number/virtual word number register 13.

Then, as indicated in (2-1), in such a case that the virtual Reg # is smaller than, or equal to Reg # of the virtual register located just before the virtual RS boundary, the absolute Reg # may be calculated as follows:

quotient of {virtual Reg #/(real RS/virtual RS)}+quotient of {virtual W #/real RS}.

Also, the absolute W # may be calculated as follows:

(virtual Reg #×virtual RS)+virtual W#−(absolute Reg #×real RS).

Further, as indicated in (2-2), in such a case that the virtual Reg # is larger than Reg # of the virtual register positioned just after the virtual RS boundary, the absolute Reg # may be calculated as follows:

quotient of {minimum Reg # of virtual register which exceeds boundary/(real RS/virtual RS1)}+quotient of {(virtual Reg #−minimum virtual Reg # of virtual register which exceeds boundary)/(real RS/virtual RS2)}+quotient of {virtual W#/real RS}.

In addition, the absolute W # may be calculated as follows:

(minimum virtual Reg # which exceeds boundary×virtual RS1)+ (virtual Reg #−minimum Reg # which exceeds boundary)× virtual RS2+virtual W−absolute Reg #×read RS.

It should also be understood that FIG. 7(2) represents such a case where the virtual RS boundary is located only at one position within the virtual structure, and the sorts of virtual RS are fixedly employed. However, the present invention is not limited only to such a single virtual RS boundary, but also not limited only to two sorts of virtual RS.

Both the absolute Reg # and the absolute W # which have been calculated by the converting circuit 20 in accordance with the above-described manner are supplied to the decoder 18 for the register number in the data register array 15, to the selector 16 for specifying the data position within the real register, and to the selecting circuit 62 so as to be processed therein.

On the other hand, in the case that the above-described virtual RS is larger than the actually transferable data width in a simultaneous manner within the memory device, the data transfer operations with respect to the virtual RS are required to be subdivided into the plural transfer operations from the memory cell to the data register array, or from the data register array to the memory cell. Now, a description will be made of such plural data transfer operations. In the memory device, "word length (MemW) being simultaneously transferable to memory cell" is previously held in a register (not shown in FIG. 1) within this memory device. Then, when the data is transferred between the memory cell 1 and the data register array 15, the control circuit 30 provided in the memory device receives the word length (MemW) supplied from this register, and a word length "Reg W" (equal to virtual RS) per virtual register supplied from any one of the registers of the mode register group 19. Then, this control circuit 30 compares the word length "MemW" with the word length "Reg W". As a result of this comparison, when the control circuit 30 judges that the word length "Reg W" is larger than the word length "MemW", this control circuit 30 produces a control signal group, and then, supplies this control signal group to the respective structural elements for executing the data transfer operations so as to control these structural elements in such a manner that while the word length "MemW" of the memory cell 1 is set as one unit, the data to be transferred are subdivided, and the subdivided data portions are transferred plural times.

In this case, the column address updating circuit 21 corresponds to such a circuit capable of automatically incrementing the address which is supplied to the memory cell in unit of MemW when the data is subdivided and the subdivided data portions are transferred. The column address updating circuit 21 receives the supply of MemW from the above-explained register, and also receives the address outputted from the column address register 81. Then, the column address updating circuit 21 adds MemW to the address outputted from the address register 81, and then supplies the addition result as a new address to the selector 8. In this selector 8, the address derived from the column address updating circuit 21 is selected to be sent to the column address register 81 for the memory cell in response to the control signal supplied from the control circuit 30. In this manner, the data for the virtual RS may be automatically read/written from/into the memory cell 1.

Figure 8:
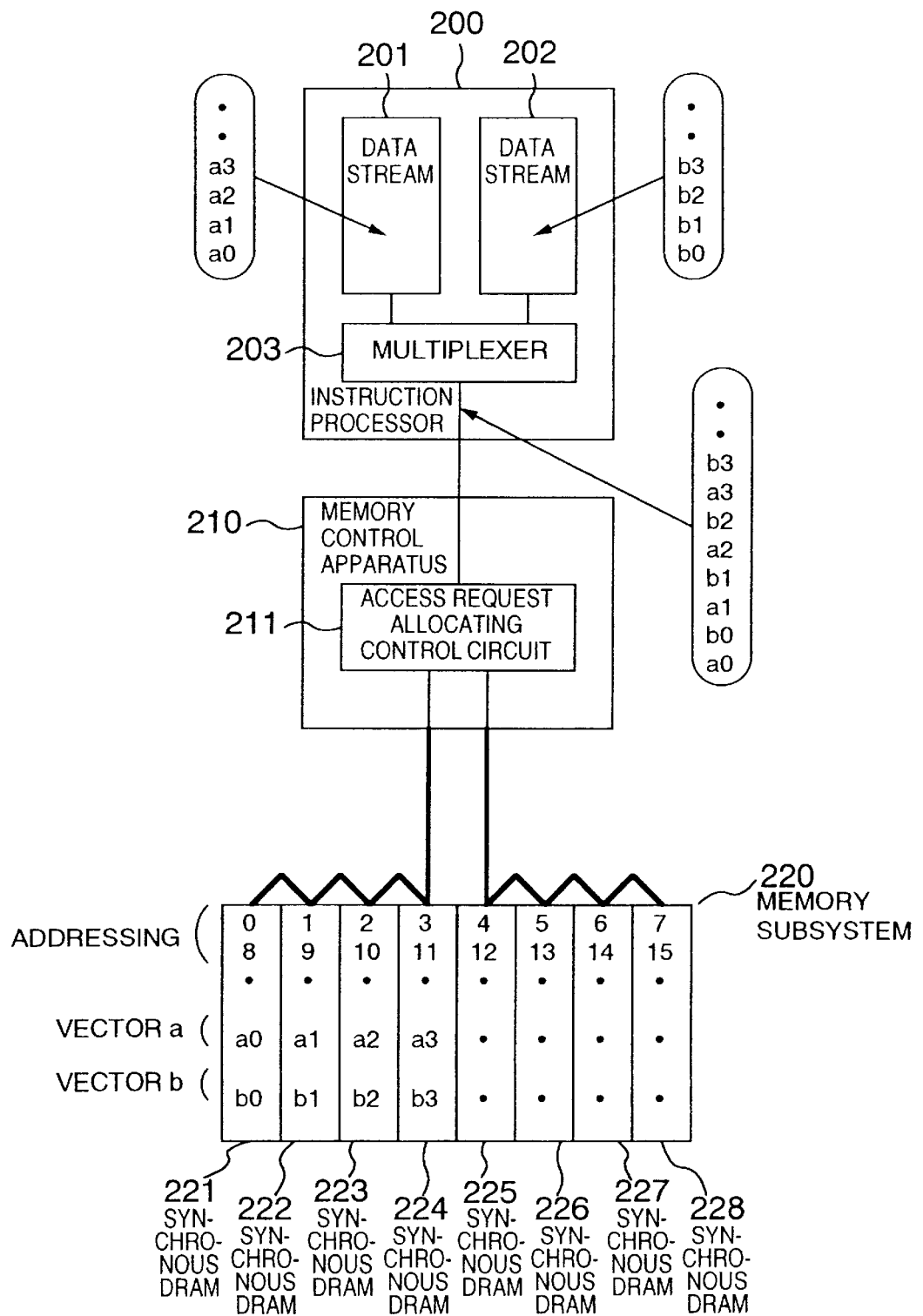
FIG. 8 is a schematic block diagram for showing the system arrangement example of the data processing apparatus with employment of the conventional synchronous DRAM.

For instance, the memory device which have been described in detail as one embodiment mode can be issued as an element capable of constituting such a memory subsystem employed in the data processing system. That is, as shown in FIG. 8, this data processing system is arranged by the instruction processor, the memory control apparatus, and this memory subsystem. In this case, in response to the request issued from the instruction processor, the address signal, the data signal, and the control signal group are supplied from the memory control apparatus to each of these memory devices. Upon receipt of the READ request, each of these memory devices outputs the data signal. In this case, the "external circuit" explained in the above description implies the instruction processor, the memory control apparatus, or various sorts of operating systems (OS) and application programs (software) executed on the data processing system. Then, various control signals such as the address signal, the data signal, the Reg-NO signal, and CS/RAS/CAS/WE/REGA signal are supplied from these hardware and also software to the above-explained address input terminal of the memory device, the data-in terminal thereof, the Reg-NO input terminal thereof, and the control signal input terminal group thereof. Also, the information of the virtual RS and the information of the virtual Reg # are set to the mode register group 19 employed in the memory device and to other registers. As a result, the memory device can execute the above-explained READ operation and WRITE operation.

It should also be noted that the memory device according to the present invention is not limited only to the above-explained arrangement shown in FIG. 8, but may be similarly applied to other various types of data processing systems, and memory subsystems of various sorts of information processing appliances. In this alternative case, these data processing apparatuses and information processing apparatuses imply, for example, general-purpose computers, parallel-executed computers, super computers, servers, workstations, personal computers, and systems containing various sorts of processors and memory subsystems.

As previously described, in accordance with the memory device of one embodiment of the present invention, the data register array functioning as the cache memory for the memory cell is virtually made of the variable structure. For example, in the data processing system shown in FIG. 8, when the excess addresses from the instruction processor to the memory subsystem are continued, or when a plurality of streams are mixed with each other and thus the access addresses are discontinued, the system structures can be provided which are optimized for the data processing operations in these cases in view of performance and also management cost.

Also, in accordance with the memory device according to one embodiment of the present invention, since the virtual structure of the data register array is changed in various modes, such a memory device can be provided which can flexibly accept the data widths and the access channel numbers required in the memory device. As a consequence, the same memory device may be widely applied to various systems selected from the personal-used computing systems to the large-scaled scientific technical computing system.

In the above-described memory device according to one embodiment of the present invention, the access addresses are multiplexed such as the row address and the column address to be supplied. However, the present invention is not limited thereto. That is, in an alternative memory device, addresses corresponding to the row address and the column address are supplied to the memory device, for example, a word address instead of the column address, and also a bit address instead of the row address are supplied to this memory device, while these addresses are not multiplexed. In this alternative case, a similar effect can be achieved.

What is claimed is:

1. A memory device including a memory cell, an address input terminal into which an address signal used to access said memory cell is entered, a data input terminal into which data used to be written into said memory cell is entered, a data output terminal for outputting data read out from said memory cell, and a control signal input terminal group into which more than one control signal used to control said memory cell is entered, comprising:

a register array having a plurality of registers, for storing thereinto a duplication of a data portion of said data stored in said memory cell;

a register information input terminal into which register information used to access said register array is entered;

a mode register group for holding thereinto structural information of said register array; and a converting circuit for converting the register information entered into said register input terminal into absolute register information by using the structural information of said register array;

wherein either of said registers owned by said register array is designated based upon said absolute register information, whereby said data entered into said data input terminal is written into said designated register, or said data held in said designated register is read.

2. A memory device as claimed in claim 1, wherein:

said memory device includes an address array for holding thereinto at least a portion of an address of a memory cell into which data is stored, said data corresponding to the data held in said register array.

3. A memory device as claimed in claim 1, wherein:

in said register array a region is selected which is accessed based upon both an absolute register number for designating one of said registers, and an absolute word number for designating a position of each of said registers.

4. A memory device as claimed in claim 3, wherein:

said register information is a virtual register number for designating one of the registers employed in said register array;

said address signal contains a virtual word number for designating a position within each of said registers owned by said register array; and said converting circuit converts said virtual register number entered into said register information input terminal into an absolute register number, and also converts said virtual word number entered into said address input terminal into an absolute word number.

5. A memory device as claimed in claim 4, wherein:

said structural information held in said mode register group is properly set by an external circuit provided outside said memory device, and contains at least a virtual register size of each of the registers owned by said register array; and said converting circuit performs the converting operation by employing said virtual register size.

6. A memory device as claimed in claim 4, wherein:

the address signal entered into said address input terminal contains a row address and a column address with respect to said memory cell; and said column address contains said virtual word number.

7. A memory device including a memory cell accessed by both either a row address or a word address and either a column address or a bit address, comprising:

a register array for temporarily holding data which is read out from said memory cell based upon either the row address or the word address into a region designated by an absolute register number and an absolute word number;

a mode register for defining at least one virtual register array based on at least one virtual register size which can be set from outside said memory device;

a converting circuit for converting both a virtual register number and a virtual word number, which are applied from outside said memory device, into the absolute register number and the absolute word number based on the value held in said mode register; and a transferring circuit for transferring data between said memory cell and said register array.

8. A memory device as claimed in claim 7, wherein:

said memory device is further comprised of:
- an address array for holding all or a portion of an address at which data was stored on said memory cell, said data being stored into a register designated by an absolute register number on an absolute register number basis; and
- a control mechanism for accessing said memory cell by employing the address derived from said address array in the case that data stored in said memory cell is accessed which corresponds to the data stored in said register array.

9. A memory device as claimed in claim 8, wherein:

said memory device is further comprised of:
- a register for holding a word length which can be transferred at one time to said memory cell;
- a register for holding a word length of said register array; and
- a circuit for comparing said word lengths held in said two registers; wherein:
  - in a case that said word length of said register array is larger than said transferable word length, when the data transfer operation is carried out between said memory cell and said register array, the data is subdivided in units of said word length of the memory cell and said subdivided data portion is transferred plural times.

10. A data processing system comprising:

- a storage apparatus constituted by a plurality of memory devices; and
- a request issuing apparatus for issuing an access request to said storage apparatus; wherein:
  - each of said memory devices for constituting said storage apparatus includes: a memory cell; an address input terminal into which an address signal used to access said memory cell is entered; a data input terminal into which data used to be written into said memory cell is entered; a data output terminal for outputting data read out from said memory cell; and a control signal input terminal group into which more than one control signal used to control said memory cell is entered; a register array having a plurality of registers, for storing thereinto a duplication of a data portion of said data stored in said memory cell; a register information input terminal into which register information used to access said register array is entered; a mode register group for holding thereinto structural information of said register array; and a converting circuit for converting the register information entered into said register input terminal into absolute register information by using the structural information of said register array; wherein:
    - said access request issued from said request issuing apparatus contains either one or all of said address signal for accessing said memory cell, said data written into said memory cell, said more than one control signal for controlling either said memory cell or said register array, and said register information for accessing said register array; and
    - in said memory device, any one of said registers employed in said register array is designated by said absolute register information; either the data entered into said data input terminal is written into the designed register or the data stored in said designated register is read therefrom by said request issuing apparatus to be thereby outputted via said data output terminal to said request issuing apparatus.

11. A data processing system as claimed in claim 10, wherein:

said request issuing apparatus includes a CPU (central processing/unit) for producing an access request; and a memory control apparatus for supplying the access request produced from said CPU to said storage apparatus.

* * * * *